United States Patent
Yamazaki

(10) Patent No.: US 12,213,282 B2
(45) Date of Patent: Jan. 28, 2025

(54) POWER CONTROL APPARATUS

(71) Applicant: DENSO CORPORATION, Kariya (JP)

(72) Inventor: Daisuke Yamazaki, Kariya (JP)

(73) Assignee: DENSO CORPORATION, Kariya (JP)

( * ) Notice: Subject to any disclaimer, the term of this patent is extended or adjusted under 35 U.S.C. 154(b) by 228 days.

(21) Appl. No.: 18/063,977

(22) Filed: Dec. 9, 2022

(65) Prior Publication Data
US 2023/0109756 A1   Apr. 13, 2023

Related U.S. Application Data

(63) Continuation of application No. PCT/JP2021/023455, filed on Jun. 21, 2021.

(30) Foreign Application Priority Data

Jul. 9, 2020 (JP) ................. 2020-118727

(51) Int. Cl.
*H05K 7/20* (2006.01)
*H02M 7/00* (2006.01)

(52) U.S. Cl.
CPC ........ *H05K 7/20272* (2013.01); *H02M 7/003* (2013.01)

(58) Field of Classification Search
CPC ........... H05K 7/20272; H05K 7/20218; H05K 7/2089; H05K 7/20845; H05K 7/20872; H05K 7/20927; H05K 5/0004; H05K 5/04; H05K 5/06; H05K 5/061; H02M 7/003
See application file for complete search history.

(56) References Cited

U.S. PATENT DOCUMENTS

| | | | |
|---|---|---|---|
| 8,785,775 B2 * | 7/2014 | Takeuchi | H05K 5/063 174/67 |
| 9,565,792 B2 * | 2/2017 | Ishikawa | H05K 7/20927 |
| 9,894,812 B2 * | 2/2018 | Sakamoto | H05K 7/20872 |
| 10,046,665 B2 * | 8/2018 | Ishikawa | B60L 3/003 |
| 2019/0150328 A1 * | 5/2019 | Miura | B60R 16/03 361/699 |

FOREIGN PATENT DOCUMENTS

JP    2017-108593 A    6/2017

* cited by examiner

*Primary Examiner* — Mandeep S Buttar
*Assistant Examiner* — Matthew Sinclair Muir
(74) *Attorney, Agent, or Firm* — Oliff PLC

(57) ABSTRACT

A power control apparatus includes a case, a cover attached on the case and a gasket which is attached on a wall of the case below the cover. The gasket includes an intermediate pipe and a seal member which seals between the intermediate pipe and the case. The cover includes a water guide portion extending along the wall of the case. The case includes at least two shielding ribs protruding from the case. The shielding ribs are located below the water guide portion. The shielding ribs include portions located above the seal member to overlap the seal member with respect to a vertical direction. The shielding ribs are located between the water guide portion and the seal member with respect to the vertical direction. Each of the shielding ribs includes an inclined portion in which a one-side portion is located lower than the other-side portion.

7 Claims, 7 Drawing Sheets

POWER CONTROL APPARATUS

CROSS REFERENCE TO RELATED APPLICATIONS

The present application is a continuation application of International Patent Application No. PCT/JP2021/023455 filed on Jun. 21, 2021, which designated the U.S. and is based on and claims the benefit of priority from Japanese Patent Application No. 2020-118727 filed on Jul. 9, 2020, the entire disclosure of the above application is incorporated herein by reference.

TECHNICAL FIELD

The present disclosure relates to a power control apparatus.

BACKGROUND

A power control apparatus may include electric circuits which generates heat. The circuit may include an inverter circuit, a converter circuit or the like. The power control apparatus may further include a case and a pipe for cooling medium. The power control apparatus is required to withstand rain water, splash or the like. In this aspect, the case and the pipe may need a rubber or resin component. In the above aspects, or in other aspects not mentioned, there is a need for further improvements in a power control apparatus.

SUMMARY

Disclosed aspects in this specification adopt different technical solutions from each other in order to achieve their respective objectives. It is to be noted that reference numerals in parentheses described in this section and the scope of the claims are examples indicating correspondences with specific means described in embodiments described later as one embodiment and do not limit the technical scope.

A power control apparatus disclosed comprises: a power control circuit configured to perform power conversion and supply an electric current to a load; a cooler which has a cooling passage and performs absorbing heat generated by the power control circuit while a cooling fluid flows through the cooling passage; a case which accommodates the power control circuit and the cooler; a seal member which seals a gap between a pipe forming a passage communicating with an interior of the cooler and the case through which the pipe is inserted; a water guide portion forming a wall extending downward from a cover member located at an upper portion of the case; and a visor-like shielding rib disposed to protrude with respect to the case and to cover a lower side of the water guide portion, wherein the shielding ribs include portions located above the seal member to overlap the seal member with respect to a vertical direction, and wherein the shielding rib has an inclined portion in which a one-side portion in the horizontal direction (lateral direction) is located lower than the other-side portion.

According to this technique, if the cover member gets wet with water, it is possible to discharge water or the along the water guide portion. Water or the like guided by the water guide portion is received by a visor-like shaped shielding rib which covers a lower side of the water guide portion, and the water or the like that has fallen on the upper surface of the shielding rib flows down from the one-side portion by the inclined portion. Since the shielding rib has a portion overlapping with the seal member in the horizontal direction above the seal member, it is possible to reduce an amount of water falling from above to the vicinity of the seal member. Since such a drainage path is constructed, it is possible to reduce exposure to water of the sealing member between the pipe forming the flow path and the insertion hole through which the pipe is inserted.

BRIEF DESCRIPTION OF DRAWINGS

The disclosure is further described with reference to the accompanying drawings in which.

DETAILED DESCRIPTION

Figure 1:
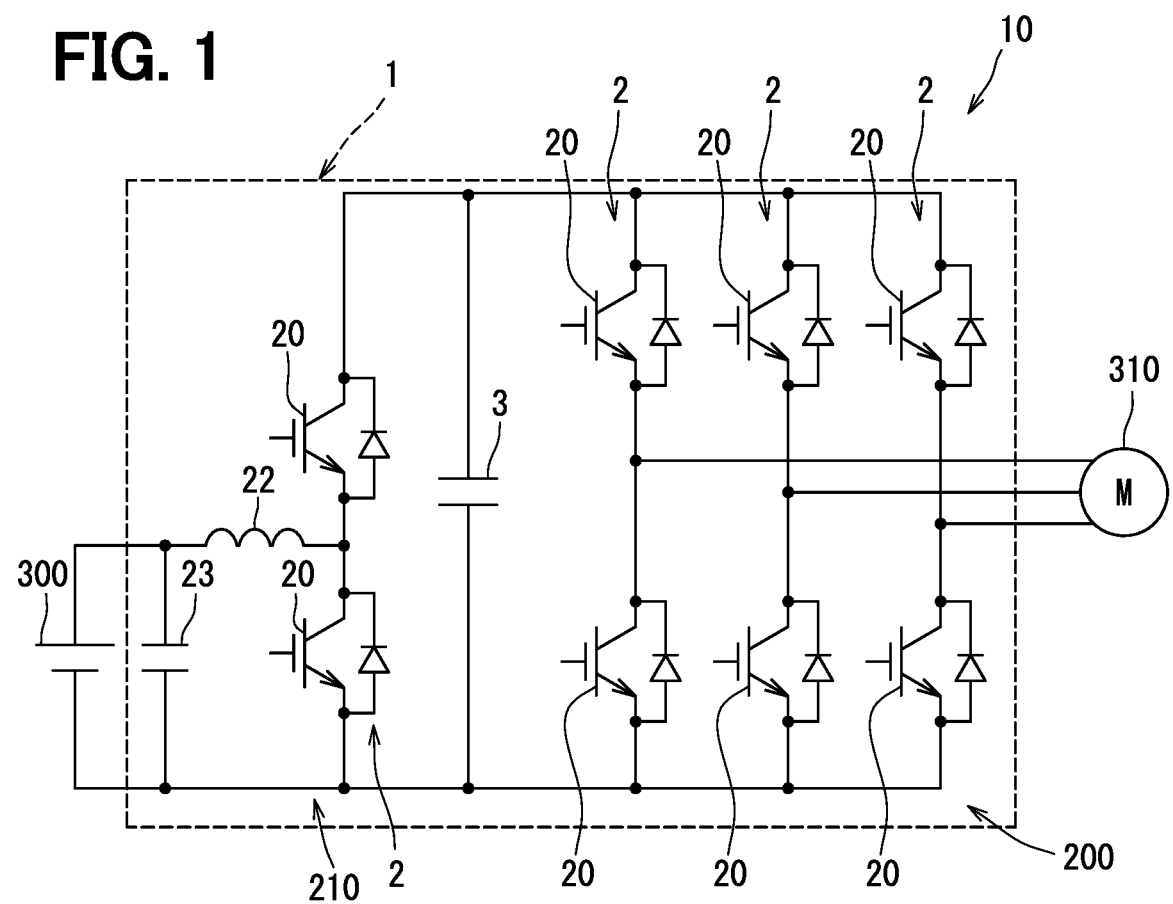
FIG. 1 is a circuit diagram of a power control apparatus.

Hereinafter, embodiments for implementing the present disclosure will be described referring to drawings. In each embodiment, portions corresponding to the elements described in the preceding embodiments are denoted by the same reference numerals, and redundant explanation thereof may be omitted. When only a part of a configuration is described in an embodiment, the other preceding embodiments can be applied to the other parts of the configuration. It may be possible not only to combine parts the combination of which is explicitly described in an embodiment, but also to combine parts of respective embodiments the combination of which is not explicitly described if any obstacle does not especially occur in combining the parts of the respective embodiments.

JP2017-108593A discloses an inverter including a rubber O-ring in a space surrounded among an inner peripheral surface of a ring member, a metal gasket, and an outer peripheral surface of a connecting pipe.

In a configuration of JP2017-108593A, it is required to reduce an amount of an outside water which may touch the components such as the O-ring. The outside water may downwardly flow an outside.

It is an objects of this disclosure in this specification to provide a power control apparatus capable of reducing a water exposure of a sealing member between a pipe for a flow path and an insertion hole for inserting the pipe.

First Embodiment

A first embodiment is described with reference to FIGS. 1 to 6. The power control apparatus may be applied to an in-vehicle power controller to be mounted on a vehicle such as an electric vehicle or a hybrid vehicle. The power control apparatus may include a heat generative component and a cooler for the heat generative component. The heat generative component may be an electric component for a converter circuit and/or an inverter circuit. The cooler uses a cooling medium such as a cooling water circulating a cooling circuit. The vehicles include passenger cars, buses, construction work vehicles, agricultural machinery vehicles, and the like. The power control apparatus capable of achieving the object specified in the specification can be applied to, for example, an inverter device, a converter device, or the like. The power control apparatus may be, for example, one of a power supply device having an AC input and a DC output, a power supply device having a DC input and a DC output, and a power supply device having an AC input and an AC output.

An example of a power control apparatus capable of achieving the object disclosed in the specification is described below. A vehicle drive system 10 is mounted on a vehicle and supplies driving force for driving drive wheels of the vehicle. The drive system 10 includes a DC power supply 300, a motor generator 310, a power control apparatus 1, and the like. The DC power supply 300 is a power supply that supplies DC power to the power control circuit, and is, for example, a plurality of secondary batteries. The secondary batteries may be a lithium ion secondary battery, a nickel hydrogen secondary battery, or an organic radical battery, for example.

The motor generator 310 includes a three-phase AC rotary electric machine, i.e., a three-phase AC motor. The motor generator 310 functions as a vehicle driving power source, that is, an electric motor. The motor generator 310 functions as a generator during regeneration. The power control apparatus 1 performs electric power conversion between the DC power supply 300 and the motor generator 310.

The power control apparatus 1 converts a DC voltage into a three-phase AC voltage according to switching control by a control circuit, and outputs the three-phase AC voltage to the motor generator 310. As a result, the vehicle travels by driving the motor generator 310 using the AC power converted from the DC power by the power control circuit. The power control apparatus 1 converts the AC power generated by AC power generation of the motor generator 310 into the DC power, and outputs the DC power to a high-potential-side power line in a circuit. The power control apparatus 1 performs electric power conversion between the DC power supply 300 and the motor generator 310.

As shown in FIG. 1, the power control apparatus 1 includes a booster circuit 210 and an inverter circuit 200. The booster circuit 210 has an input side connected to the DC power supply 300 and an output side connected to the inverter circuit 200. The booster circuit 210 includes a power converter, a reactor 22, and a capacitor 23 for noise reduction. The capacitor 23 is, for example, a filter capacitor that reduces a noise from a power supply. The booster circuit 210 boosts the voltage of the DC power supply 300 in a boost mode and outputs it to the inverter circuit 200. The booster circuit 210 steps down the DC voltage output from the inverter circuit 200 in a step-down mode and supplies it to the DC power supply 300.

The booster circuit 210 includes the reactor 22, a power control circuit, and the capacitor 23 for noise reduction. The booster circuit 210 includes semiconductor modules 2 for providing a power control circuit such as the converter and/or the inverter. The booster circuit 210 is also a converter circuit that includes the reactor 22 and an upper and lower arm circuit. The power control circuit of the booster circuit 210 converts the DC voltage of the DC power supply 300 into a boosted voltage by turning on and off the semiconductor element 20 included in the semiconductor module 2.

The booster circuit 210 includes one set of the upper and lower arm circuit including two arms connected in series. The arm on the high potential side of the upper and lower arm circuit is referred to as an upper arm, and the arm on the low potential side is referred to as a lower arm. Each of the upper arm and the lower arm has a semiconductor device 20 for power control. The reactor 22 has one terminal connected to the DC power supply 300 and the capacitor 23, and the other terminal connected between the upper arm and the lower arm. The reactor 22 is configured to be able to store and release electrical energy.

The inverter circuit 200 includes semiconductor modules 2 and form a power control circuit. The semiconductor modules 2 are connected in parallel to a smoothing capacitor 3. The power control circuit converts a DC power boosted by the booster circuit 210 into an AC power by turning on and off the semiconductor elements 20 included in the semiconductor modules 2.

The motor generator 310 is coupled to an axle of the electric vehicle. Rotational energy of the motor generator 310 is transmitted to drive wheels of the electric vehicle via the axle. Rotational energy of the drive wheels is transmitted to the motor generator 310 via the axle. The motor generator 310 generate kinetic power by an AC power supplied from the power control apparatus 1. Thereby, a propulsive force is supplied to the drive wheels. The motor generator 310 regenerates by using the rotational energy transmitted from the drive wheels. The AC power generated by this regeneration is converted into a DC power by the power control apparatus 1 as described above. This DC power is supplied to the DC power supply 300. This DC power is also supplied to various electrical loads mounted on the vehicle.

In the inverter circuit 200, the smoothing capacitor 3 is connected to the input side of the power control circuit, and the motor generator 310, which is an example of a load, is connected to the output side. The smoothing capacitor 3 mainly smooths the DC voltage supplied from the DC power supply 300 and the booster circuit 210. The smoothing capacitor 3 is connected between the power line for the high potential side and the power line for the low potential side. The power line on the high potential side is connected to the positive electrode of the DC power supply 300. The power line on the low potential side is connected to the negative electrode of the DC power supply 300. The positive electrode of the smoothing capacitor 3 is connected to the power line on the high potential side between the DC power supply 300 or the booster circuit 210 and the power control circuit. The negative electrode of the smoothing capacitor 3 is connected to the power line on the low potential side between the DC power supply 300 or the booster circuit 210 and the power control circuit.

A P-busbar is provided on the power line on the high potential side. A N-busbar is provided on the power line on the low potential side. The P-busbar and the N-busbar are provided on the power lines on the input side with respect to the power control circuit of the power control apparatus 1.

The power control apparatus 1 includes three-phase legs connected in parallel between the P-busbar connected to the positive electrode of the DC power supply 300 and the N-busbar connected to the negative electrode of the DC power supply 300. Each one of phase legs includes semiconductor elements 20 connected in series between the P-busbar and the N-busbar. The inverter circuit 200 includes three sets of the upper and lower arm circuit including two arms connected in series. The three upper and lower arm circuits correspond to, for example, U-phase, V-phase, and W-phase, respectively, and are arranged in this order from the smoothing capacitor 3. A higher potential one of each of the upper and lower arm circuits may be referred to as an upper arm. A lower potential one of each of the upper and lower arm circuits may be referred to as a lower arm.

Each one of the arms has an IGBT as a switching element and a diode. The IGBT is an insulated gate bipolar transistor, which is a type of transistor. The IGBT and diode are provided on a semiconductor substrate. A semiconductor chip provided with an IGBT and a diode corresponds to the semiconductor element 20. In the upper arm, the collector is connected to the power line on the high potential side. In the lower arm, the emitter is connected to the power line on the low potential side. The emitter on the upper arm and the collector on the lower arm are connected to each other. The anode of the diode is connected to the emitter of the corresponding IGBT, and the cathode is connected to the collector of the corresponding IGBT.

The control circuit generates a drive command for operating the IGBT and outputs the drive command to the drive circuit. The control circuit generates the drive command based on a torque request input from a higher-level ECU and signals detected by various sensors. Various sensors include a current sensor, a rotation angle sensor, and a voltage sensor. The control circuit outputs a PWM signal as a drive command. The control circuit has a microcomputer.

The drive circuit is a driver which supplies a drive voltage to a gate of the IGBT of the corresponding arm based on the drive command of the control circuit. The drive circuit drives, i.e., turns on and turns off, the corresponding IGBT 11 by applying a drive voltage. The power control apparatus 1 includes, for example, one drive circuit with respect to one arm for a phase.

The power control apparatus 1 includes busbars including input busbars and output busbars. The power control apparatus 1 includes busbars for both a power input and a power output. The busbars in the power control apparatus 1 include a conductive member to be connected to an input terminal and a conductive member to be connected to an output terminal. The busbars are conductive members connected to an input side or an output side to at least one of the semiconductor modules 2, the smoothing capacitor 3 and the capacitor 23. Since such busbars each form one of electric power paths and generate heat, the busbars release heat to peripheral parts. The input busbars are conductive members to which power is supplied from the DC power supply 300. The input busbars are, for example, the P-busbar and the N-busbar.

The output busbars are, for example, busbars provided on electric power paths through which an output current of the arms flow to the motor generator 310. The current sensor detects an output current flowing through the output busbars. One of the output busbars is provided on an electric power path that connects a connection portion between the upper arm and the lower arm to a winding of the motor generator 310 in the U-phase. One of the output busbars is provided on an electric power path that connects a connection portion between the upper arm and the lower arm to a winding of the motor generator 310 in the V-phase. One of the output busbars is provided on an electric power path that connects a connection portion between the upper arm and the lower arm to a winding of the motor generator 310 in the W-phase. The output busbars also called a U-phase busbar, a V-phase busbar, and a W-phase busbar. The U-phase busbar, the V-phase busbar, and the W-phase busbar are provided on the power line on the output side with respect to the power control circuit.

The power control apparatus 1 includes a case 11 for accommodating electric components. The case 11 forms a part of a container. The case 11 accommodates a capacitor unit, a power module unit, a reactor unit, and a control board on which a control circuit is mounted.

The capacitor unit includes at least the smoothing capacitor 3. The capacitor unit accommodates the smoothing capacitor 3 which is encapsulated in a resin in a state where terminals to be connected to other electric components are exposed. The smoothing capacitor 3 accommodates a resin-sealed capacitor element. An encapsulating resin is made of a thermosetting resin such as an epoxy resin. The encapsulating resin is supplied and hardened to fill a gap between a case for accommodating the smoothing capacitor 3 and parts of the smoothing capacitor 3, e.g., the capacitor element and the terminals. A part of the terminals or the like for the smoothing capacitor 3 protrudes from the encapsulating resin. The condenser unit is fixed to a wall of the case 11 by using a fastener such as a bolt, a screw, or a rivet, or by using a joining member such as a welding member or a brazing member. The condenser unit may be in contact with a part of a cooler 6 through which a cooling fluid flows.

The reactor unit accommodates the reactor 22 which is encapsulated in a resin in a state where terminals to be connected to other electric components are exposed. An encapsulating resin is made of a thermosetting resin such as an epoxy resin. The encapsulating resin is supplied and hardened to fill a gap between a case for accommodating the reactor 22 and parts of the reactor 22, e.g., the main body and the terminals. A part of the terminals of the reactor 22 protrudes from the encapsulating resin. The reactor unit is fixed in a state where the reactor unit is in contact with a part of the cooler 6 by using a fastener such as a bolt, a screw, or a rivet, or by using a joining member such as a welding member or a brazing member.

Figure 2:
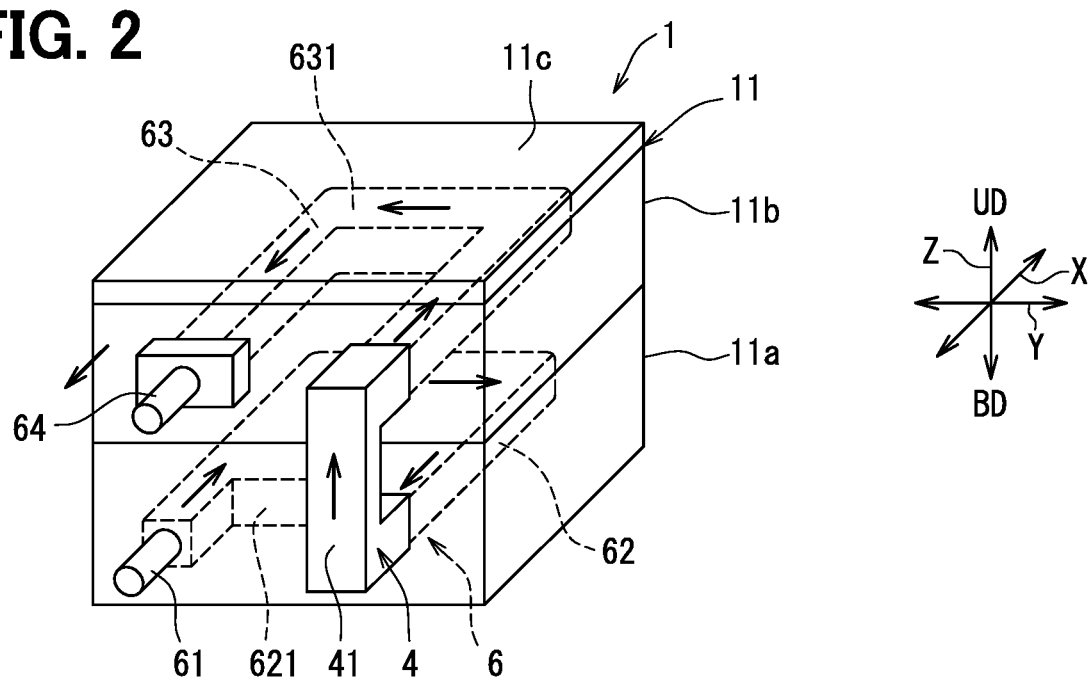
FIG. 2 is a schematic diagram showing cooling channels in a power control apparatus.
Figure 3:
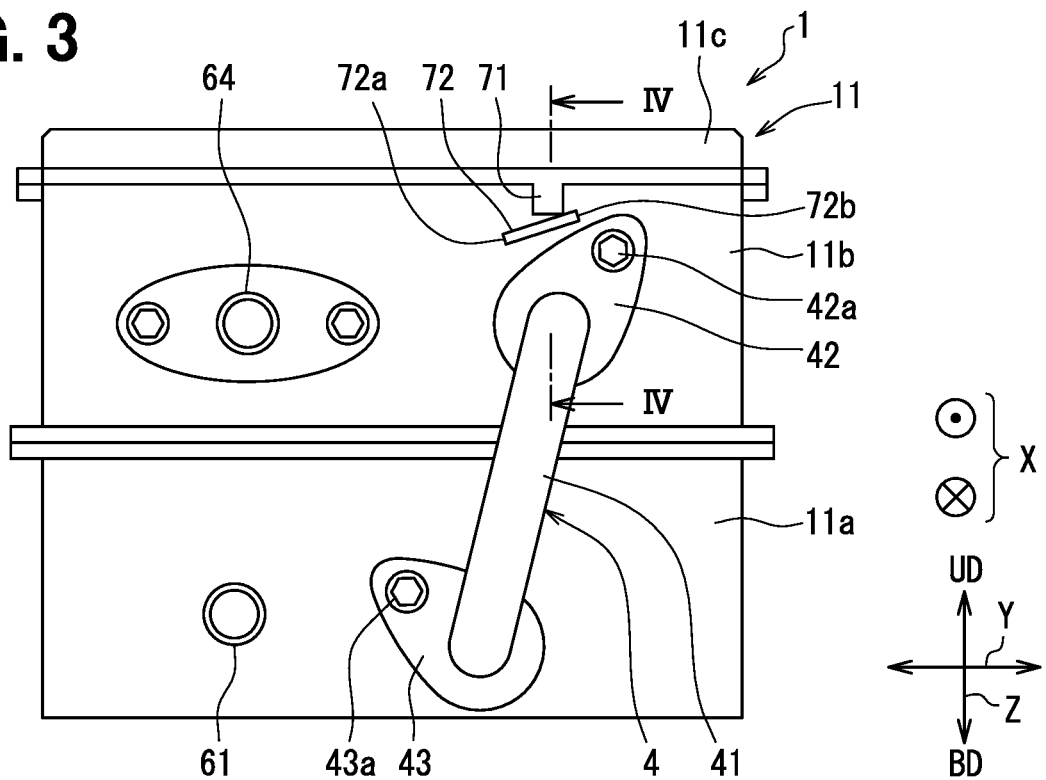
FIG. 3 is a plan view showing the power control apparatus.

FIG. 2 shows cooling channels formed by the cooler 6. FIG. 3 is a front view of the power control apparatus 1 and shows an appearance of the case 11. The X-direction and Y-direction in the drawings are the horizontal direction and the vertical direction of the power control apparatus 1. The Z-direction in the drawings is the height direction of the power control apparatus 1.

The case 11 is a container case which is formed by combining a plurality of case members. The case 11 is formed by including, for example, a first case member 11*a*, a second case member 11*b*, and a cover member 11*c*. The first case member 11*a* is a lower case in the case 11. The second case member 11*b* is an upper case in the case 11. The second case member 11*b* is a member attached to the first case member 11*a* so as to cover the internal space of the first case member 11*a*. The cover member 11*c* is a member attached to the second case member 11*b* so as to cover an internal space defined by the first case member 11*a* and the second case member 11*b*. Each part of the case 11 is made of a metal material. Each part of the case 11 includes, for example, a molded member manufactured by an aluminum die-cast molding. Each part of the case 11 may be configured to be made of a resin material.

The first case member 11*a* integrally includes, for example, a bottom wall, a plurality of horizontal walls vertically arranged on a peripheral edge of the bottom wall, and a joining portion. The second case member 11*b* integrally includes, for example, a plurality of side walls, a joining portion to the first case member 11a, and a joining portion to the cover member 11c. The joining portion of the first case member 11a and the second case member 11b are connected to each other by screws or the like to form a box having an open upper end. The case 11 is formed by connecting a box body having an upper end opening and a cover member 11c with screws or the like at the joining portion thereof.

The semiconductor module 2 includes a main body incorporating the semiconductor element 20, and power terminals and control terminals protruding from the main body. The power terminals include input terminals to which a DC voltage is applied and output terminals connected to output-side busbars on a side to the motor generator 310. The input terminal is connected to a terminal of the smoothing capacitor 3 and electrically connected to an output unit of the DC power supply 300 via an input busbar. The signal terminals are connected to the control circuit mounted on the control board. The control circuit configures a circuit on which electronic components, such as an arithmetic element, that controls the operation of the semiconductor element 20 is mounted.

The power control apparatus 1 includes a cooler 6 which thermally coupled with at least one of the semiconductor modules 2. The cooler 6, e.g., cools at least one of the semiconductor modules 2 by using a heat absorbing action of a cooling fluid flowing therein. The cooler 6 is fixed to, for example, a wall of the case 11 by using a fastener such as a bolt, a screw, or a rivet, or by using a joining member such as a welding member or a brazing member. The cooler 6 includes an upstream passage portion 62, a connecting pipe member 4, and a downstream passage portion 63 and forms a series of passages. An integrally formed unit including the semiconductor modules 2 and passage portions of the cooler 6 provides a power module unit. Each part forming a passage in the cooler 6 is made of a material with high thermal conductivity, for example is made of aluminum.

An external inlet pipe 61 is a fluid introduction part in the cooler 6. The external inlet pipe 61 is a pipe extending from the side wall of the case 11 to the outside. A downstream portion of the external inlet pipe 61 is connected to an upstream passage portion 62. The external inlet pipe 61 is connected to the power control apparatus 1 to form a passage for introducing the cooling fluid to the cooler 6. An external outflow pipe 64 is a fluid discharge part in the cooler 6. The external outlet pipe 64 extends outward from the same side wall of the case 11 from which the external inlet pipe 61 extends. An upstream portion of the external outlet pipe 64 is connected to a downstream passage portion 63. The external outlet pipe 64 is connected to the power control apparatus 1 to form a passage for discharging the cooling fluid from the cooler 6.

The upstream passage portion 62 forms a cooling passage 621 provided in an internal space surrounded all sides by the first case member 11a. The upstream passage portion 62 is provided with a configuration capable of absorbing heat generated by the semiconductor modules 2. The upstream passage portion 62 forms, for example, the cooling passages 621 alternately stacked with the semiconductor modules 2. The downstream passage portion 63 forms a turn passage 631 provided in an internal space surrounded all sides by the second case member 11b. The turn passage 631 is a U-turn passage that flows down from the inside of the connecting pipe member 4 into the external outlet pipe 64.

The upstream passage portion 62 and the downstream passage portion 63 are connected by the connecting pipe member 4. The connecting pipe member 4 includes a connecting pipe 41 forming a passage extending in a U shape. The connecting pipe member 4 includes an upstream connecting portion 43 connected to the upstream passage portion 62 at its upstream end, and a downstream connecting portion 42 connected to the downstream passage portion 63 at its downstream end. The upstream connecting portion 43 is fixed to the side wall of the first case member 11a by means of fasteners 43a such as screws and bolts. The downstream connecting portion 42 is fixed to the side wall of the second case member 11b by means of fasteners 42a such as screws and bolts. The upstream connecting portion 43 and the downstream connecting portion 42 are fixed to the side wall located on the same side of the case 11. The connecting pipe 41 forms a U-shaped passage which enables an outward flow from the case 11, enables an upward flow of the cooling fluid, and enables an inward flow to the case 11 again. The external outlet pipe 64, the external inlet pipe 61 and the connecting pipe 41 extend out of the case 11 from the same side wall of the case 11. The connecting pipe member 4 is made of a resin material. The connecting pipe member 4 may be configured to be made of metal.

The cooling fluid absorbs heat generated by the semiconductor modules 2 while flowing through the cooling passage 621 in the upstream passage portion 62. The upstream passage portion 62 is in contact with both end surfaces of each of the semiconductor modules 2 in the stacking direction. The semiconductor modules 2 are cooled at both end surfaces by the upstream passage portions 62 adjacent in the stacking direction. The cooling fluid flowing inside the cooler 6 is preferably an antifreeze liquid having a large heat capacity, such as LLC (available as Long-Life Coolant). A gas such as an air may be employed as the cooling fluid.

The external inlet pipe 61 and the external outlet pipe 64 communicate with a heat dissipation device installed outside the power control apparatus 1. A heat dissipation device is a device such as a heat exchanger in which a heat dissipation is performed from a cooling fluid to the outside. The heat dissipation device is, for example, a radiator. The cooling fluid is introduced from the heat dissipation device to the upstream passage portion 62 and the downstream passage portion 63 via the external inlet pipe 61. After flowing down the external inlet pipe 61, the cooling fluid absorbs heat in the upstream passage portion 62, passes through the downstream passage portion 63 and the external outlet pipe 64, and flows out of the cooler 6 and returns to the heat dissipation device.

Figure 4:
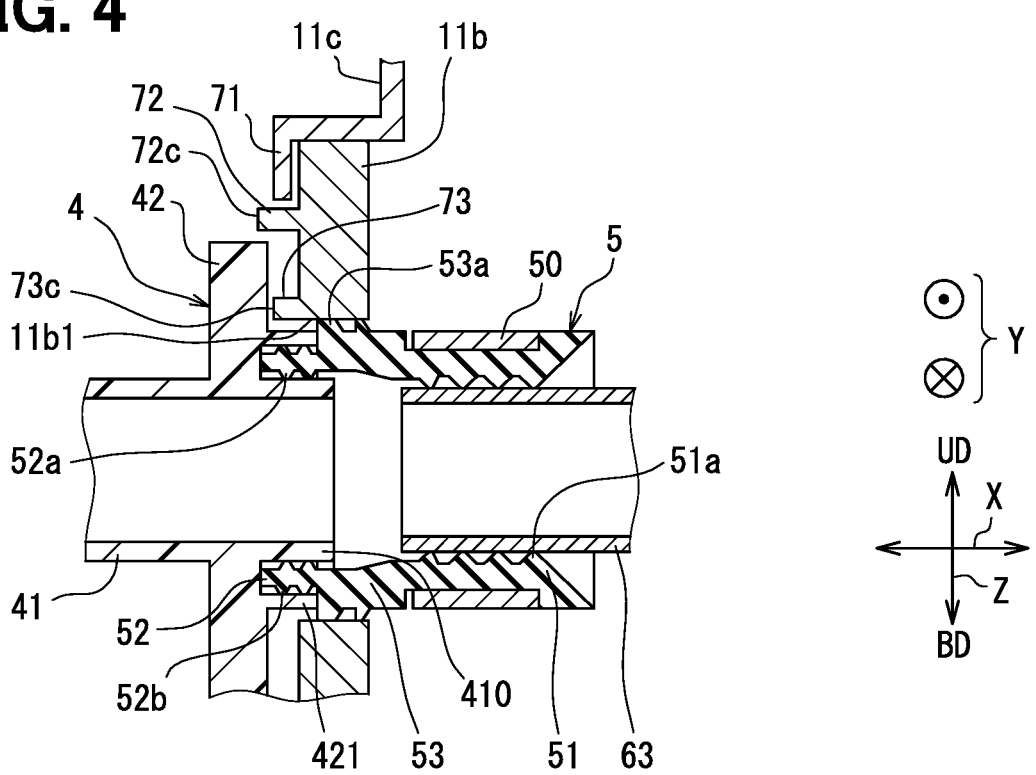
FIG. 4 is a partial cross-sectional view taken along a line IV-IV in FIG. 3.
Figure 5:
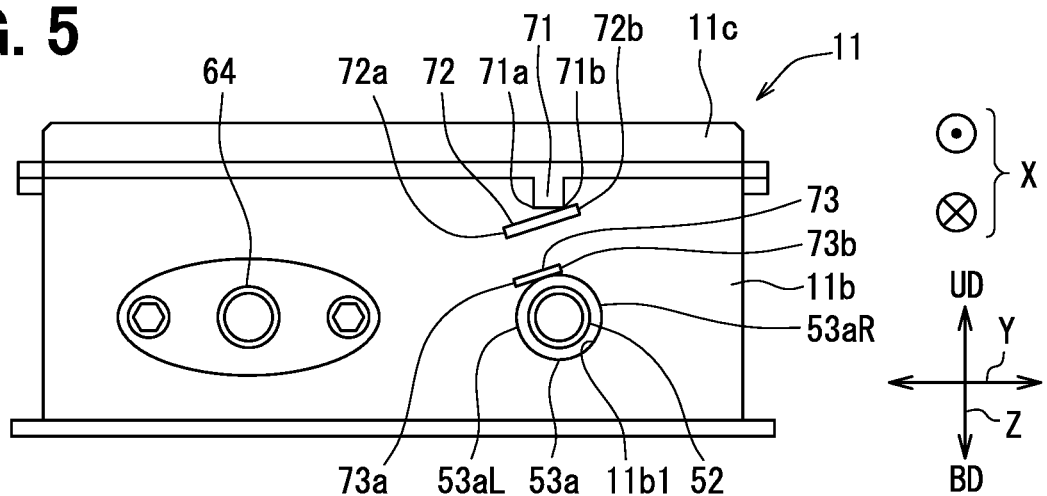
FIG. 5 is a front view showing a seal portion, a water guide portion, and shielding ribs of a first embodiment.
Figure 6:
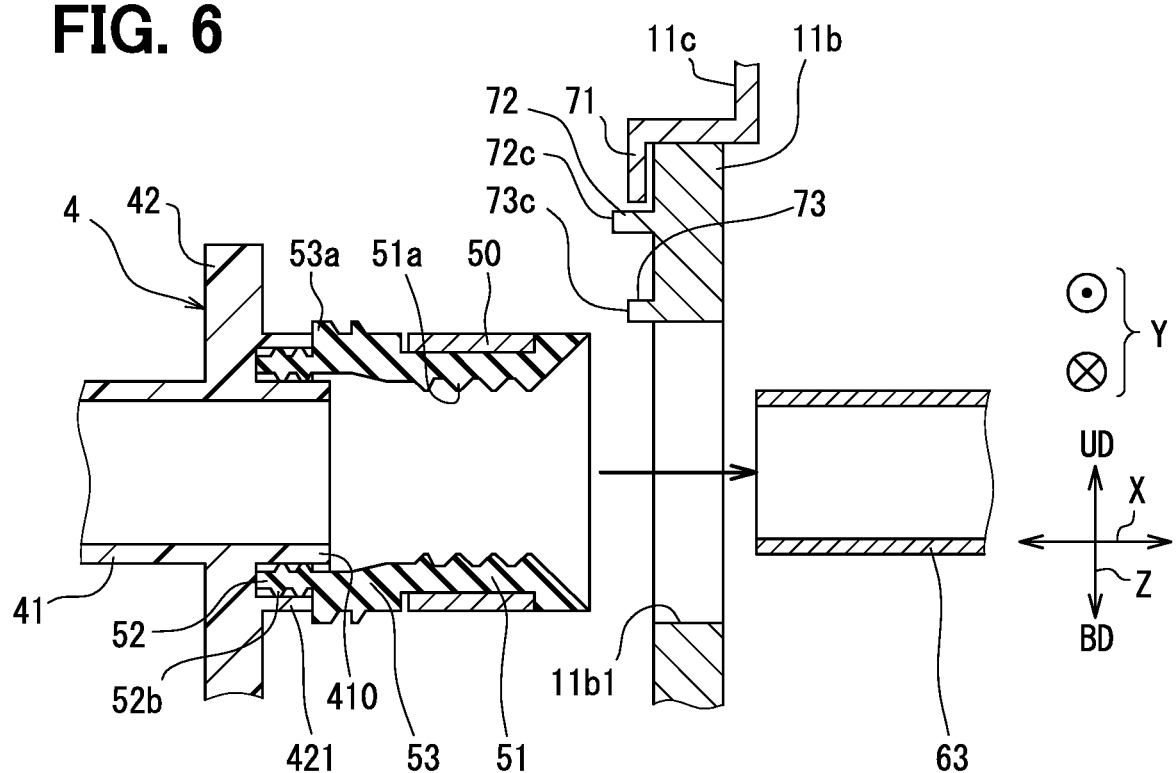
FIG. 6 is an exploded view showing a state before connecting a passage pipe of a cooler and a gasket member.

A path along which water splashed on the cover member 11c flows downward is described with reference to FIGS. 3 to 6. FIG. 3 shows a water guide portion 71 and a first shielding rib 72. FIG. 4 is a partial cross-sectional view showing the positional relationship among the seal member 53a, the water guide portion 71, a first shielding rib 72 and a second shielding rib 73. FIG. 5 is a frontal view showing the positional relationship among the seal member 53a, the water guide portion 71, the first shielding rib 72 and the second shielding rib 73. FIG. 6 is an exploded view showing a state before connecting the downstream passage portion 63 of the cooler 6 and the gasket member 5.

As shown in FIG. 4, the connecting pipe 41 and the downstream passage portion 63 are connected via the gasket member 5. The connecting pipe 41, the gasket member 5 and the downstream passage portion 63 are arranged in a coaxial manner. The gasket member 5 includes a downstream pipe 51, an upstream pipe 52, and an intermediate pipe 53 connecting the downstream pipe 51 and the upstream pipe 52. The downstream pipe 51, the intermediate pipe 53, and the upstream pipe 52 are integrally formed to form a cylindrical member. Each part of the gasket member 5 is easily elastically deformed by an external force, and is made of rubber, for example. The downstream pipe 51 and the downstream passage portion 63 are connected by being fitted to each other. The downstream pipe 51 is circumscribed and connected to an upstream end portion of the downstream passage portion 63. The gasket member 5 may be made of a material that allows at least each seal portion to be easily elastically deformed. The gasket member 5 may be a configuration in which a portion except for the seal member is made of a material harder than the seal member. The gasket member 5 may be a configuration in which a portion except for the seal member is made of a hard material.

A seal member 51a is provided on an inner peripheral portion of the downstream pipe 51. The seal member 51a has a vertical cross-sectional shape including at least one wedge-shape which is narrowed toward the central axis of the downstream pipe 51. The vertical cross-sectional shape may include a plurality of wedge-shapes which are arranged in a side by side manner in the downstream pipe 51 along the central axis of the downstream pipe 51. A collar member 50 formed in a cylindrical shape is fitted to the downstream pipe 51. The collar member 50 applies an external force to press the downstream pipe 51 toward the central axis. Therefore, the seal member 51a is deformed by being pressed against the outer peripheral surface of the downstream passage portion 63. The seal member 51a is in close contact with the downstream passage portion 63. The seal member 51a provides a seal between an inside of the downstream passage portion 63 and an inside of the case 11. The seal member 51a is in close contact with the outer peripheral surface of the downstream passage portion 63 to prevent water from entering the case 11 from the inside of the downstream passage portion 63. The seal member 51a may be composed of a close contacting member such as an O-ring or a packing seal.

The connecting pipe member 4 and the gasket member 5 are connected by being fitted together. The downstream connecting portion 42 of the connecting pipe member 4 is provided with an inside pipe 410 projecting as a cylindrical shape from a downstream side surface and an outside pipe 421 surrounding the entire circumference of the inside pipe 410. The inside pipe 410 is formed to have an inner diameter equivalent to that of the connecting pipe 41. The connecting pipe member 4 has an annular groove formed between an inner peripheral surface of the outside pipe 421 and an outer peripheral surface of the inside pipe 410. The downstream connecting portion 42 and the gasket member 5 are connected by inserting an upstream pipe 52 into the annular groove in a fitting manner.

A seal member 52a is provided on an inner peripheral portion of the upstream pipe 52. The seal member 52a has a vertical cross-sectional shape including at least one wedge-shape which is narrowed toward the central axis of the upstream pipe 52. A seal member 52b is provided on an outer peripheral portion of the upstream pipe 52. The seal member 52b has a vertical cross-sectional shape including at least one wedge-shape which is narrowed outward from the central axis of the upstream pipe 52. The vertical cross-sectional shape may include a plurality of wedge-shapes which are arranged in a side by side manner on the upstream pipe 52 along the central axis of the upstream pipe 52.

The seal member 52a is deformed by being pressed against an outer peripheral surface of the inside pipe 410, and the seal member 52a is in close contact with the inside pipe 410. The seal member 52b is deformed by being pressed against an outer peripheral surface of the outside pipe 421, and the seal member 52b is in close contact with the outside pipe 421. The sealing member 52a and the sealing member 52b provide seals between an inside of the connecting pipe 41 and an outside of the case 11. The seal member 52a and the seal member 52b are in close contact with the outer peripheral surface of the inside pipe 410 and the inner peripheral surface of the outside pipe 421, thereby suppressing water leakage from the inside of the connecting pipe 41 to the outside of the case 11. The seal member 52a or the seal member 52b may be composed of a close contacting member such as an O-ring or a packing seal.

A seal member 53a is provided on an outer peripheral portion of the intermediate pipe 53. The seal member 53a has a vertical cross-sectional shape including at least one wedge-shape which is narrowed outward from the central axis of the intermediate pipe 53. The vertical cross-sectional shape may include a plurality of wedge-shapes which are arranged in a side by side manner in the intermediate pipe 53 along the central axis of the intermediate pipe 53. The seal member 53a is deformed by being pressed against the inner peripheral surface 11b1 forming the through hole provided in the second case member 11b, and the seal member 53a is in close contact with the inner peripheral surface 11b1. The seal portion 53a provides a seal between an outside and an inside of the case 11. The seal member 53a is in close contact with the inner peripheral surface 11b1 of the insertion hole of the case 11, thereby suppressing water leakage from the outside of the case 11 to the inside of the case 11. The seal portion 53a may be composed of a close contacting member such as an O-ring or a packing seal. This through hole is an insertion hole through which a pipe forming a flow passage is inserted. Moreover, the seal member 53a is not limited to the configuration in which it come into contact with the inner peripheral surface of the insertion hole. For example, the seal member 53a may be configured to come into contact with the opening end surface of the case forming the insertion hole.

As shown in FIGS. 4 and 5, the cover member 11c is provided with the water guide portion 71. The water guide portion 71 is a wall portion which has a shape protruding downward further than the joining portion of the cover member 11c to the second case member 11b. The water guide portion 71 extends downward from a predetermined portion at the joining portion of the cover member 11c. The water guide portion 71 extends along the second case member 11b. The water guide portion 71 extends to cover a predetermined portion of the upper portion of the second case member 11b. The water guide portion 71 is a plate-like portion which has a one-end portion 71a in the horizontal direction and an other-end portion 71b in the horizontal direction. According to this shape, the water or the like flowing down the surface of the water guide portion 71 tends to drip downward from a lower end of the one-end portion 71a or a lower end of the other-end portion 71b.

The second case member 11b is provided with the shielding rib which protrudes further than the water guide portion 71 in a direction crossing the second case member 11b at a location on a lower side BD of the water guide portion 71. The shielding rib is provided so as to shield the lower side of the water guide portion 71. The shielding rib is a visor-like shaped portion extending from the side wall of the second case member 11b. The shielding rib is a plate-like portion that has a thickness in the vertical direction and is elongated in the horizontal direction. The shielding rib is a plate-like portion of which the one-side portion in the horizontal direction is located lower than the other-side portion.

The shielding ribs include the first shielding rib 72 positioned directly below the water guide portion 71 and the second shielding rib 73 positioned directly below the first shielding rib 72. The first shielding rib 72 protrudes to an outside of the case 11 further than the seal member 53*a*. The first shielding rib 72 has a lower end portion 72*a* on the one-side portion in the horizontal direction and an upper end portion 72*b* on the other-side portion in the horizontal direction. The first shielding rib 72 has an inclined portion between the upper end portion 72*b* and the lower end portion 72*a*. The first shielding rib 72 has a distal end portion 72*c* located on a position protruding further than the water guide portion 71 with respect to the side wall of the second case member 11*b*. The distal end portion 72*c* is positioned on an upper side UD above the downstream connecting portion 42 and protrudes to a position where it overlaps the downstream connection portion 42 in the vertical direction.

The second shielding rib 73 is a visor-like shaped portion which protrudes further than the inner peripheral surface 11*b*1 in a direction intersecting the second case member 11*b* to a location above the insertion hole of the second case member 11*b*. The second shielding rib 73 protrudes to the outside of the case 11 further than the seal member 53*a*. The second shielding rib 73 has a lower end portion 73*a* on the one-side portion in the horizontal direction and an upper end portion 73*b* on the other-side portion in the horizontal direction. The second shielding rib 73 has an inclined portion between the upper end portion 73*b* and the lower end portion 73*a*. The second shielding rib 73 has a distal end portion 73*c* located on a position protruding from the side wall of the second case member 11*b* more than the water guide portion 71. The distal end portion 73*c* is positioned on an upper side UD above the outside pipe 421 and protrudes to a position where it overlaps the outside pipe 421 in the vertical direction and approaches or comes in contact with the downstream connecting portion 42.

The distal end portion 72*c* and the distal end portion 73*c* are provided so as to overlap each other in the vertical direction. The distal end portion 72*c* may be configured to be located at a position protruding from the side wall of the second case member 11*b* more than the distal end portion 73*c*. As shown in FIG. 5, the lower end portion 72*a* is located on a one-side further than the one-end portion 71*a*. An upper end portion 72*b* is located on the other side further than the other-end portion 71*b*. The first shielding rib 72 covers the water guide portion 71 at a lower side thereof. An entire body of the water guide portion 71 is provided so as to vertically overlap the first shielding rib 72.

The lower end portion 72*a* is located on a one side further than the lower end portion 73*a*. The upper end portion 72*b* is located on the other side further than the upper end portion 73*b*. The first shielding rib 72 covers the second shielding rib 73 from above. An entire body of the second shielding rib 73 is provided so as to vertically overlap the first shielding rib 72.

The lower end portion 72*a* is located on a one-side of further than the one-end portion 53*a*L of the seal member 53*a* in an annular shape. The upper end portion 72*b* is located on a one-side further than the other-end portion 53*a*R of the seal member 53*a*. The first shielding rib 72 covers a portion of the seal member 53*a* including the one-end portion 53*a*L from above. The first shielding rib 72 is located above the seal member 53*a*. The first shielding rib 72 covers the seal member 53*a* over a length from the one-end portion 53*a*L to a portion directly below the upper end portion 72*b* in the horizontal direction.

The lower end portion 73*a* is located on a one-side further than the one-end portion 71*a*. An upper end portion 73*b* is located on the same position as the other end portion 71*b* or on a one-side further than the other-end portion 71*b*. The second shielding rib 73 covers a part or all of the water guide portion 71 including the one-end portion 71*a* at a lower side thereof. The lower end portion 73*a* is located on a one-side further than the one-end portion 53*a*L of the seal member 53*a*. The upper end portion 73*b* is located on a one-side further than the other-end portion 53*a*R of the seal member 53*a*. The second shielding rib 73 is located above the seal member 53*a*. The second shielding rib 73 covers the seal member 53*a* over a length from the one-end portion 53*a*L to a portion directly below the upper end portion 73*b* in the horizontal direction.

In order to assemble components into a state shown in FIG. 4, the following procedure is performed. The collar member 50 is fitted around the outer periphery of the downstream pipe 51, and the upstream pipe 52 of the gasket member 5 is fitted into the annular groove between the outside pipe 421 and the inside pipe 410. Accordingly, the inside of the connecting pipe 41 and an outside of the case 11 may be sealed by the seal member 52*a* and the seal member 52*b*. Next, a unitary member of the collar member 50 and the gasket member 5 shown in FIG. 6 is inserted into the case 11 along the inner peripheral surface 11*b*1 through the insertion hole. This unitary member is inserted deeply until the downstream pipe portion 51 is fitted onto an outside of the downstream passage pipe portion 63 and the seal member 53*a* comes into contact with the inner peripheral surface 11*b*1. Accordingly, the inside of the downstream passage pipe 63 and the inside of the case 11 can be sealed by the seal member 51*a* and the seal member 53*b*. The inside and the outside of the case 11 can be sealed by the seal member 51*a* and the seal member 53*b*.

For example, if the cover member 11*c* get wet with water or the like, the water or the like flows along outer surface of the cover member 11*c* and may further flow down a surface of the water guide portion 71. Water or the like that has flowed down the surface of the water guide portion 71 drips down from the lower ends of the one-end portion 71*a* and the other-end portion 71*b*, and then adheres to the upper surface of the first shielding rib 72. Water or the like adhering to the upper surface of the first shielding rib 72 flows down the upper surface toward the lower end portion 72*a* and drips down from the lower end portion 72*a*. Water or the like that drips from a lower end portion 72*a* falls as it is and is drained below the power control apparatus. Therefore, since water or the like does not enter the inner peripheral surface 11*b*1 of the insertion hole provided in the case 11, it is possible to reduce a water exposure of the seal member 53*a*. Also, if water or the like drips from the lower end portion 72*a* and falls on the upper surface of the second shielding rib 73, it flows down on the upper surface toward the lower end portion 73*a* and drips from the lower end portion 73*a*. Water or the like that drips from a lower end 73*a* falls as it is and is drained below the power control apparatus. Also in this case, since water or the like does not enter the inner peripheral surface 11*b*1 of the insertion hole provided in the case 11, it is possible to reduce a water exposure of the seal member 53*a*.

Functions and advantages produced by the power control apparatus 1 according to the first embodiment are described. The power control apparatus 1 includes the power control circuit and the cooler 6 having the cooling passage to absorb heat generated by the power control circuit when the cooling fluid flows through the cooling passage. The power control apparatus 1 includes a pipe which forms a passage communicating with an interior of the cooler 6, and a seal member 53a which seals a gap between the pipe and the case 11 through which the pipe is inserted. The power control apparatus 1 includes the water guide portion 71 and at least one shielding ribs. The water guide portion 71 forms a wall extending downward from the cover member 11c located on an upper portion of the case 11. The shielding rib is disposed to protrude with respect to the case 11 and to cover a lower side of the water guide portion 71e in a manner similar to a visor. The shielding rib spreads between the water guide portion 71 and the seal member 53a. Therefore, the shielding rib covers and shields the seal member 53a from the water dropping from the water guide portion 71. The shielding rib has a portion that overlaps the seal member 53a in the horizontal direction above the seal member 53a. The shielding ribs include inclined portions in which the one-side portion in the horizontal direction is located lower than the other-side portion.

According to this configuration, if the cover member 11c gets wet with water, it is possible to discharge water or the like along the water guide portion 71. Water or the like guided by the water guide portion 71 is received by a visor-shaped shielding rib which covers the lower side of the water guide portion 71. Water or the like received on the upper surface of the shielding rib flows down from the one-side portion due to the inclined portion. Since the shielding rib has a portion overlapping with the seal member 53a in the horizontal direction above the seal member 53a, it is possible to reduce an amount of water falling from above to the vicinity of the seal member. Since such a drainage path is constructed, it is possible to reduce a water exposure of the sealing member 53a between the pipe forming the flow path and the insertion hole through which the pipe is inserted.

The one-side portion of the shielding rib is located on a one side further than the one-end portion 53aL of the seal member 53a in the horizontal direction. According to this configuration, when water or the like fallen on the shielding rib falls from the lower end portion, it is possible to further reduce the water exposure of the seal portion 53a by dripping down water from further outside in the horizontal direction than the seal member 53a.

The shielding ribs include the first shielding rib 72 located directly below the water guide portion 71 and the second shielding rib 73 located directly below the first shielding rib 72. Each of the first shielding rib 72 and the second shielding rib 73 has an inclined portion in which the one-side portion in the horizontal direction is positioned lower than the other-side portion. According to this configuration, the effect of reducing the water exposure of the seal member 53a can be further enhanced by the shielding ribs arranged vertically in two stages.

At least one of the first shielding rib 72 and the second shielding rib 73 has a one-side portion in the horizontal direction which is located on a one side further than the one-end portion 53aL of the seal member in the horizontal direction. According to this configuration, one or both of the shielding ribs arranged vertically in two stages can drop water or the like to further outside of the seal portion 53a in the horizontal direction. This can further enhance the effect of reducing the water exposure of the seal member 53a.

Second Embodiment

A power control apparatus 1 according to a second embodiment is described with reference to FIG. 7. The power control apparatus of the second embodiment is different from the power control apparatus of the first embodiment in a configuration of shielding ribs. Configurations, actions, and effects not specifically described in the second embodiment are the same as those in the first embodiment, and points different from the first embodiment is described below.

Figure 7:
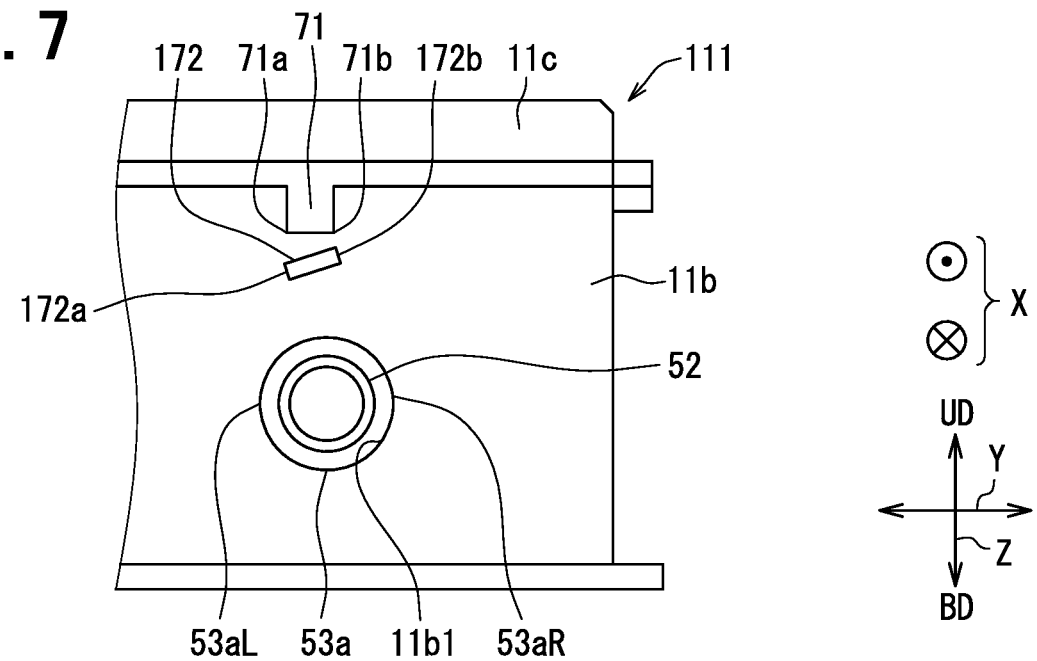
FIG. 7 is a front view showing a seal portion, a water guide portion, and shielding ribs of a second embodiment.

As shown in FIG. 7, the case 111 has a shielding rib 172. The shielding rib 172 is a visor-like shaped portion extending from the side wall of the second case member 11b. The shielding rib 172 is a plate-like portion that has a thickness in the vertical direction and is elongated in the horizontal direction. The shielding rib 172 is a plate-like portion of which the one-side portion in the horizontal direction is located lower than the other-side portion. The shielding rib 172 has a lower end portion 172a on a one-side portion in the horizontal direction and an upper end portion 172b on the other-side portion in the horizontal direction. The shielding rib 172 has an inclined portion between the upper end portion 172b and the lower end portion 172a.

The shielding rib 172 has a distal end portion located on a position protruding from the side wall of the second case member 11b more than the water guide portion 71. The distal end portion of the shielding rib 172 is positioned on an upper side UD above the downstream connecting portion 42 and protrudes to a position where it overlaps the downstream connecting portion 42 in the vertical direction. The shielding rib 172 is a visor-like shaped portion which protrudes further than the inner peripheral surface 11b1 in a direction intersecting the second case member 11b at a location above the insertion hole of the second case member 11b. The second shielding rib 73 protrudes to the outside of the case 11 further than the seal member 53a.

As shown in FIG. 7, the lower end portion 172a is located directly below the one-end portion 71a or on a one side further than the one-end portion 71a. The upper end portion 172b is located directly below the other end portion 71b or on the other side further than the other-end portion 71b. The shielding rib 172 covers the water guide portion 71 at a lower side thereof. An entire body of the water guide portion 71 is provided so as to vertically overlap the shielding rib 172.

The lower end portion 172a is located on the other side further than the one-end portion 53aL of the seal member 53a in an annular shape. The upper end portion 172b is located on a one-side further than the other-end portion 53aR of the seal member 53a. The shielding rib 172 covers a part of the seal member 53a from above except for the one-end portion 53aL and the other-end portion 53aR.

If water or the like on the cover member 11c flows down along the surface of the water guide portion 71, it drips down from the lower ends of the one-end portion 71a and the other-end portion 71b, and then adheres to the upper surface of the shielding rib 172. Water or the like adhering to the upper surface of the shielding rib 172 flows down the upper surface toward the lower end portion 172a and drips down from the lower end portion 172a. Water or the like that has dripped from the lower end portion 172a falls onto the outer pipe 421 of the connecting pipe member 4, and is drained downward of the power control apparatus along the outer peripheral surface of the outer pipe 421. Since water or the like does not fall directly onto the portion of the inner peripheral surface 11b1 whose upper side is covered by the shielding rib 172, it is possible to reduce a water exposure of the seal member 53a.

Third Embodiment

A power control apparatus 1 according to a third embodiment is described with reference to FIG. 8. The power control apparatus of the third embodiment is different from the power control apparatus of the first embodiment in a configuration of shielding ribs. Configurations, actions, and effects not specifically described in the third embodiment are the same as those in the first embodiment, and points different from the first embodiment will be described below.

Figure 8:
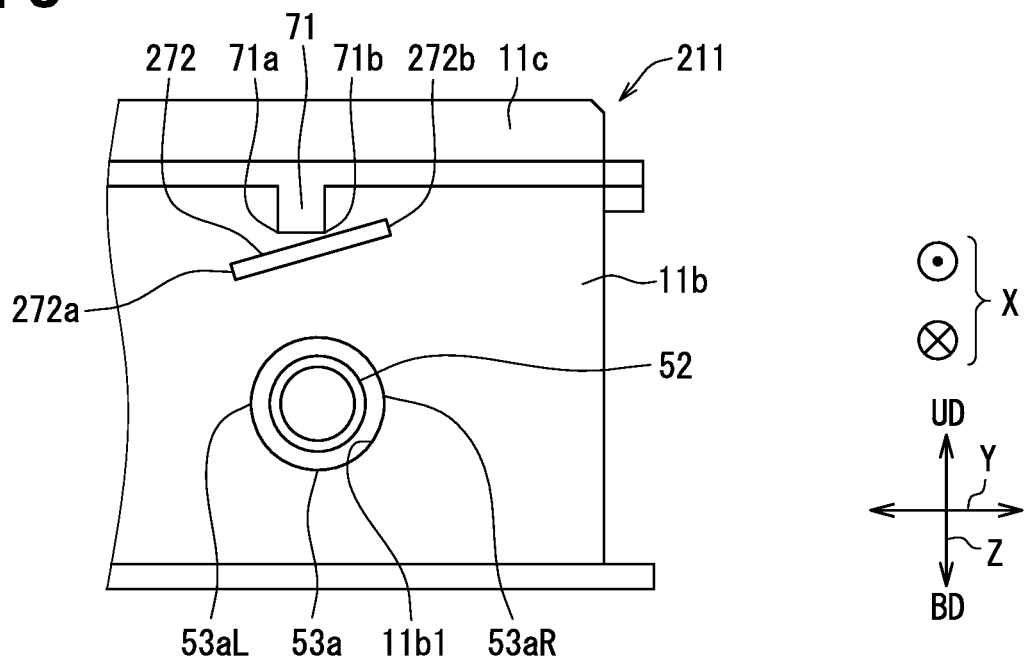
FIG. 8 is a front view showing a seal portion, a water guide portion, and shielding ribs of a third embodiment.

As shown in FIG. 8, the case 211 has a shielding rib 272. The shielding rib 272 is provided so as to shield the lower side of the water guide portion 71. The shielding rib 272 is a visor-like shaped portion extending from the side wall of the second case member 11b. The shielding rib 272 is a plate-like portion that has a thickness in the vertical direction and is elongated in the horizontal direction. The shielding rib 272 is a plate-like portion of which a one-side portion in the horizontal direction is located lower than the other-side portion.

The shielding rib 272 is positioned directly below the water guide portion 71 and covers the entire body of the water guide portion 71. The shielding rib 272 protrudes to the outside of the case 11 further than the seal member 53a. The second shielding rib 272 has a lower end portion 272a on a one-side portion in the horizontal direction and an upper end portion 272b on the other-side portion in the horizontal direction. The shielding rib 272 has an inclined portion between the upper end portion 272b and the lower end portion 272a. The shielding rib 272 has a distal end portion located on a position protruding from the side wall of the second case member 11b more than the water guide portion 71. The distal end portion of the shielding rib 272 is positioned on an upper side UD above the downstream connecting portion 42 and protrudes to a position where it overlaps the downstream connecting portion 42 in the vertical direction.

As shown in FIG. 7, the lower end portion 272a is located on a one side further than the one-end portion 71a. An upper end portion 272b is located on the other side further than the other-end portion 71b. An entire body of the water guide portion 71 is provided so as to vertically overlap the shielding rib 272. The lower end portion 272a is located on a one side further than the one-end portion 53aL of the seal member 53a. The upper end portion 272b is located on the other side further than the other-end portion 53aR of the seal member 53a. The shielding rib 272 covers the horizontal direction of the sealing member 53a over a length from the one-end portion 53aL to the other-end portion 53aR. The entire body of the seal member 53a is covered with the shielding rib 272 in the horizontal direction.

If water or the like on the cover member 11c flows down along the surface of the water guide portion 71, it drips down from the lower ends of the one-end portion 71a and the other-end portion 71b, and then adheres to the upper surface of the shielding rib 272. Water or the like adhering to the upper surface of the shielding rib 272 flows down the upper surface toward the lower end portion 272a and drips down from the lower end portion 272a. Water or the like that drips from the lower end portion 272a falls laterally outside the seal member 53a and is further drained below the power control apparatus. Therefore, since water or the like does not enter the inner peripheral surface 11b1 of the insertion hole provided in the case 11, it is possible to reduce a water exposure of the seal member 53a.

The shielding rib 272 has a length that covers the entirety of the seal member 53a in the horizontal direction. According to this configuration, water or the like falling on the shielding rib 272 falls further outside of the seal member 53a in the horizontal direction. The shielding rib 272 can further enhance the effect of reducing the water exposure of the seal member 53a.

Fourth Embodiment

A power control apparatus 1 according to a fourth embodiment is described with reference to FIG. 9. The power control apparatus of the fourth embodiment is different from the power control apparatus of the first embodiment in a configuration of shielding ribs. Configurations, actions, and effects not specifically described in the fourth embodiment are the same as those in the first embodiment, and points different from the first embodiment will be described below.

Figure 9:
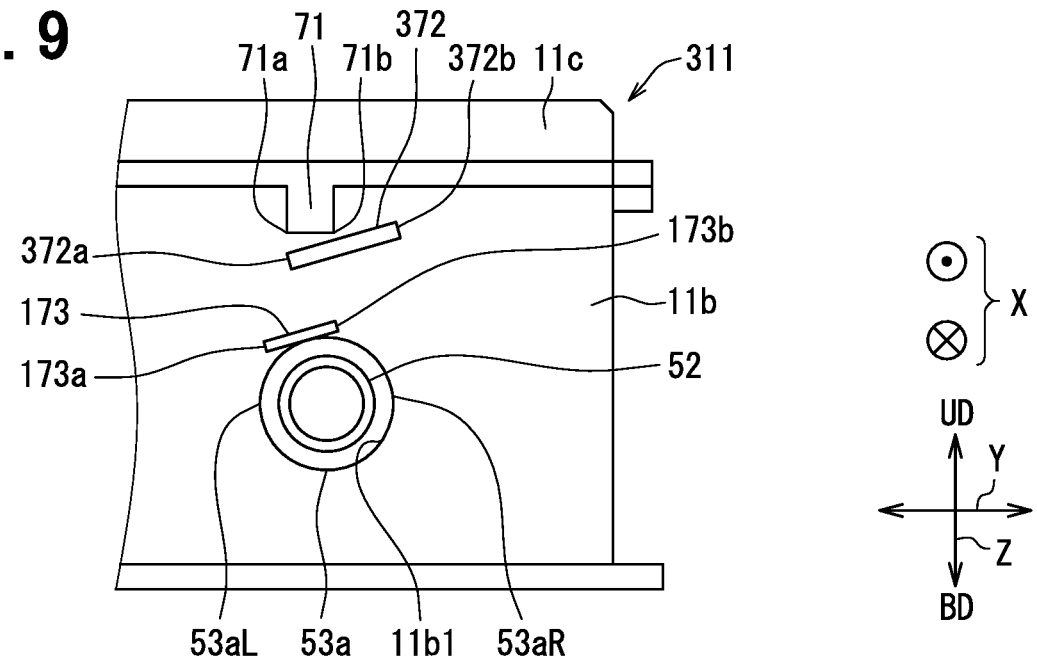
FIG. 9 is a front view showing a seal portion, a water guide portion, and shielding ribs of a fourth embodiment.

As shown in FIG. 9, the case 311 includes the first shielding rib 372 and the second shielding rib 173. The second case member 11b is provided with two shielding ribs which protrude further than the water guide portion 71 in a direction crossing the second case member 11b at a location on a lower side BD of the water guide portion 71. Two shielding ribs are provided so as to shield the lower side of the water guide portion 71. Two shielding ribs are visor-like shaped portions extending from the side wall of the second case member 11b. Two shielding ribs are plate-like portions that have thickness in the vertical direction and are elongated in the horizontal direction. Two shielding ribs are plate-like portions of which one-side portions in the horizontal direction are located lower than the other-side portions.

The first shielding rib 372 is located directly below the water guide portion 71. The second shielding rib 173 is located directly below the first shielding rib 72. The first shielding rib 372 protrudes to the outside of the case 11 further than the seal member 53a. The first shielding rib 372 has a lower end portion 372a on a one-side portion in the horizontal direction and an upper end portion 372b on the other-side portion in the horizontal direction. The first shielding rib 372 has an inclined portion between the upper end portion 372b and the lower end portion 372a. The first shielding rib 372 has a distal end portion located on a position protruding from the side wall of the second case member 11b more than the water guide portion 71. The distal end portion of the first shielding rib 372 is positioned on an upper side UD above the downstream connecting portion 42 and protrudes to a position where it overlaps the downstream connecting portion 42 in the vertical direction.

The second shielding rib 173 is a visor-like shaped portion which protrudes further than the inner peripheral surface 11b1 in a direction intersecting the second case member 11b at a location above the insertion hole of the second case member 11b. The second shielding rib 173 protrudes to the outside of the case 11 further than the seal member 53a. The second shielding rib 173 has a lower end portion 173a on a one-side portion in the horizontal direction and an upper end portion 173b on the other-side portion in the horizontal direction. The second shielding rib 173 has an inclined portion between the upper end portion 173b and the lower end portion 173a. The second shielding rib 173 has a distal end portion located on a position protruding from the side wall of the second case member 11b more than the water guide portion 71. The distal end portion of the second shielding rib 173 is positioned on an upper side UD above the outside pipe 421 and protrudes to a position where it overlaps the outside pipe 421 in the vertical direction and approaches or comes in contact with the downstream connecting portion 42.

The distal end portion of the first shielding rib 372 and the distal end portion of the second shielding rib 173 are provided so as to overlap each other in the vertical direction. The distal end portion of the first shielding rib 372 may be configured to be located on a position protruding from the side wall of the second case member 11b more than the distal end portion of the second shielding rib 173. The lower end portion 372a is located directly below the one-end portion 71a or on a one side further than the one-end portion 71a. The upper end portion 372b is located on the other side further than the other-end portion 71b. The first shielding rib 372 covers the water guide portion 71 at a lower side thereof. An entire body of the water guide portion 71 is provided so as to vertically overlap the first shielding rib 372.

The lower end portion 372a is located on the other side further than the lower end portion 173a. The upper end portion 372b is located on the other side further than the upper end portion 173b. The first shielding rib 372 covers a portion of the second shielding rib 173 except for the lower end portion 173a. A portion of the second shielding rib 173 excluding the lower end portion 173a is provided so as to vertically overlap the first shielding rib 372.

The lower end portion 372a is located on the other side further than the one-end portion 53aL of the seal member 53a. The upper end portion 372b is located on the other side further than the other-end portion 53aR of the seal member 53a. The first shielding rib 372 covers a portion of the seal member 53a including the one-end portion 53aL from above.

The lower end portion 173a is located on a one side further than the one-end portion 71a. The upper end portion 173b is located at the same position as the other-end portion 71b or on a one side further than the other-end portion 71b in the horizontal direction. The second shielding rib 173 covers a part or all of the water guide portion 71 including the one-end portion 71a at a lower side thereof.

The lower end portion 173a is positioned at the same position as the one-end portion 53aL of the seal member 53a or on a one side of the one-end portion 53aL in the horizontal direction. The upper end portion 173b is located on a one side of further than the other-end portion 53aR of the seal member 53a. The second shielding rib 173 is located above the seal member 53a. The second shielding rib 173 covers the seal member 53a over a length from the one-end portion 53aL to a portion directly below the upper end portion 173b in the horizontal direction. A total horizontal length of the two shielding ribs from the lower end portion 173a to the upper end portion 372b covers an entirety in the horizontal direction of the sealing member 53a from above. The total horizontal length of the first shielding rib 372 and the second shielding rib 173 is a length that covers the entirety in the horizontal direction of the seal member 53a from above. As described above, the horizontal lengths of the first shielding rib 372 and the second shielding rib 173 viewed from above are set to cover the entirety of the seal member 53a in the horizontal direction.

If water or the like on the cover member 11c flows down along the surface of the water guide portion 71, it drips down from the lower ends of the one-end portion 71a and the other-end portion 71b, and then adheres to the upper surface of the first shielding rib 372. Water or the like adhering to the upper surface of the first shielding rib 372 flows down the upper surface toward the lower end portion 372a and drips down from the lower end portion 372a. Water or the like dripping from the lower end portion 372a falls on the upper surface of the second shielding rib 173, flows down the upper surface toward the lower end portion 173a, and drips from the lower end portion 173a. Water or the like that has dripped from the lower end portion 173a falls along the outer peripheral surface of the outer pipe 421 or directly falls and is further drained below the power control apparatus. Therefore, since water or the like does not enter the inner peripheral surface 11b1 of the insertion hole provided in the case 11, it is possible to reduce a water exposure of the seal member 53a.

The horizontal length of the first shielding rib 372 and the second shielding rib 173 viewed from above is the length covering the entire body of the seal member 53a in the horizontal direction. According to this configuration, the first shielding rib 372 and the second shielding rib 173 can receive water or the like over a wide range in the horizontal direction, and further, drips water from the lower end portion to further outside of the seal member 53a in the horizontal direction.

Fifth Embodiment

A power control apparatus 1 according to a fifth embodiment is described with reference to FIG. 10. The power control apparatus of the fifth embodiment is different from the power control apparatus of the first embodiment in a configuration of shielding ribs. Configurations, actions, and effects not specifically described in the fifth embodiment are the same as those in the fifth embodiment, and points different from the first embodiment will be described below.

Figure 10:
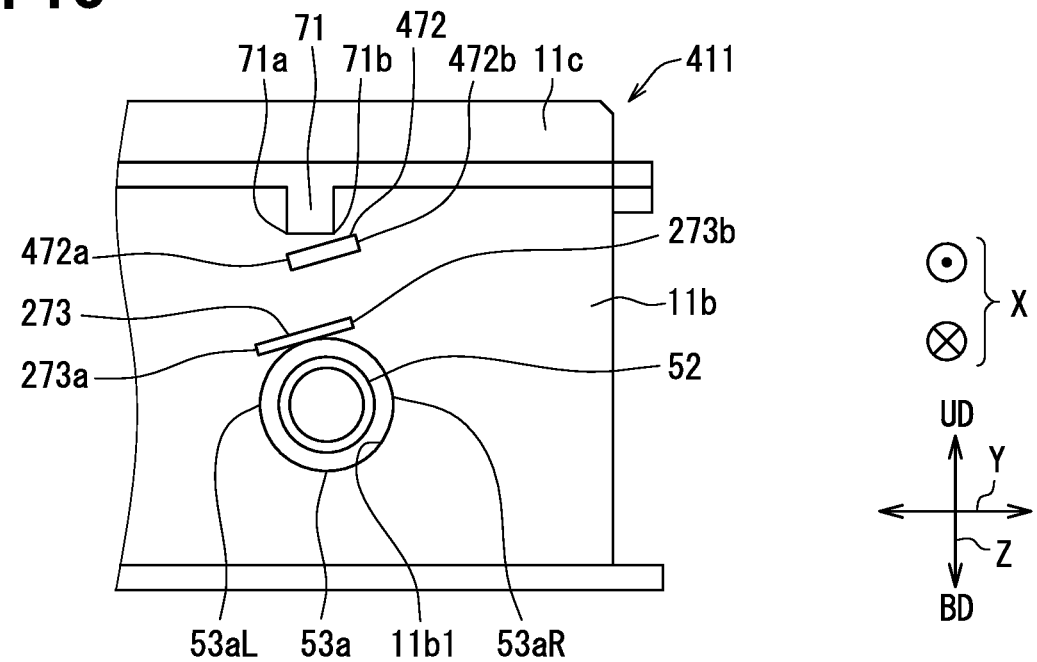
FIG. 10 is a front view showing a seal portion, a water guide portion, and shielding ribs of a fifth embodiment.

As shown in FIG. 10, the case 411 includes the first shielding rib 472 and the second shielding rib 273. Similar to the fourth embodiment, two shielding ribs are visor-like shaped portions protruding further than the water guide portion 71 in the direction intersecting the second case member 11b at a location on a lower side BD of the water guide portion 71. Two shielding ribs are provided so as to shield the lower side of the water guide portion 71. Two shielding ribs extend from the side wall of the second case member lib similar to the fourth embodiment. Similar to the fourth embodiment, two shielding ribs are plate-like portions having a thickness in the vertical direction, being elongated in the horizontal direction, and having a one-side portion in the horizontal direction positioned lower than the other-side portion.

The first shielding rib 472 is located directly below the water guide portion 71. The second shielding rib 273 is located directly below the first shielding rib 472. The first shielding rib 472 protrudes to the outside of the case 11 further than the seal member 53a. The first shielding rib 472 has a lower end portion 472a on a one-side portion in the horizontal direction and an upper end portion 472b on the other-side portion in the horizontal direction. The first shielding rib 472 has an inclined portion between the upper end portion 472b and the lower end portion 472a. The first shielding rib 472 has a distal end portion located on a position protruding from the side wall of the second case member 11b more than the water guide portion 71. The distal end portion of the first shielding rib 472 is positioned on an upper side UD above the downstream connecting portion 42 and protrudes to a position where it overlaps the downstream connecting portion 42 in the vertical direction.

The second shielding rib 273 is a visor-like shaped portion which protrudes further than the inner peripheral surface 11b1 in a direction intersecting the second case member 11b at a location above the insertion hole of the second case member 11b. The second shielding rib 273 protrudes to the outside of the case 11 further than the seal member 53a. The second shielding rib 273 has a lower end portion 273a on a one-side portion in the horizontal direction and an upper end portion 273b on the other-side portion in the horizontal direction. The second shielding rib 273 has an inclined portion between the upper end portion 273b and the lower end portion 273a. The second shielding rib 273 has a distal end portion located on a position protruding with respect to the side wall of the second case member 11b further than the water guide portion 71. The distal end portion of the second shielding rib 273 is located on an upper side UD above the outside pipe 421 and protrudes to a position where it overlaps the outside pipe 421 in the vertical direction and approaches or comes in contact with the downstream connecting portion 42.

The distal end portion of the first shielding rib 472 and the distal end portion of the second shielding rib 273 are provided so as to overlap each other in the vertical direction. The distal end portion of the first shielding rib 472 may be configured to be located on a position protruding from the side wall of the second case member 11b further than the distal end portion of the second shielding rib 273. The lower end portion 472a is positioned directly below the one-end portion 71a or on a one side of the one-end portion 71a. The upper end portion 472b is located on the other side further than the other-end portion 71b. The first shielding rib 472 covers the water guide portion 71 at a lower side thereof. An entire body of the water guide portion 71 is provided so as to vertically overlap the first shielding rib 472.

The lower end portion 472a is located on the other side further than the lower end portion 273a. The upper end portion 472b is located on the other side further than the upper end portion 273b. The first shielding rib 472 covers a portion of the second shielding rib 273 except for the lower end portion 273a. A portion of the second shielding rib 273 excluding the lower end portion 273a is provided so as to vertically overlap the first shielding rib 472.

The lower end portion 472a is located on the other side further than the one-end portion 53aL of the seal member 53a. The upper end portion 472b is located on a one side further than the other-end portion 53aR of the seal member 53a. The lower end portion 273a is located on a one side further than the one-end portion 71a. The upper end portion 273b is positioned at the same position as the other-end portion 71b or on a one side of the other-end portion 71b in the horizontal direction. The second shielding rib 273 covers a part or all of the water guide portion 71 including the one-end portion 71a at a lower side thereof.

The lower end portion 273a is located at the same position as the one-end portion 53aL of the seal member 53a or on a one side further than the one-end portion 53aL in the horizontal direction. The upper end portion 273b is located on a one side further than the other-end portion 53aR of the seal member 53a. The second shielding rib 273 is located above the seal member 53a. The second shielding rib 273 covers the seal member 53a over a length from the one-end portion 53aL to a portion directly below the upper end portion 273b in the horizontal direction.

If water or the like on the cover member 11c flows down along the surface of the water guide portion 71, it drips down from the lower ends of the one-end portion 71a and the other-end portion 71b, and then adheres to the upper surface of the first shielding rib 472. Water or the like adhering to the upper surface of the first shielding rib 472 flows down the upper surface toward the lower end portion 472a and drips down from the lower end portion 472a. Water or the like dripping from the lower end portion 472a falls on the upper surface of the second shielding rib 273, flows down the upper surface toward the lower end portion 273a, and drips from the lower end portion 273a. Water or the like that has dripped from the lower end portion 273a falls along the outer peripheral surface of the outer pipe 421 or directly falls and is further drained below the power control apparatus. Therefore, since water or the like does not enter the inner peripheral surface 11b1 of the insertion hole provided in the case 11, it is possible to reduce a water exposure of the seal member 53a.

Sixth Embodiment

A power control apparatus 1 according to a sixth embodiment is described with reference to FIGS. 11 and 12. The power conversion device of the sixth embodiment is different from the above-described embodiments in a point that it includes a guide portion 74 that guides water to a water guide portion 71. Configurations, actions, and effects not particularly described in the sixth embodiment are similar to those of the above-described embodiments, and differences from the above-described embodiments will be described below.

Figure 11:
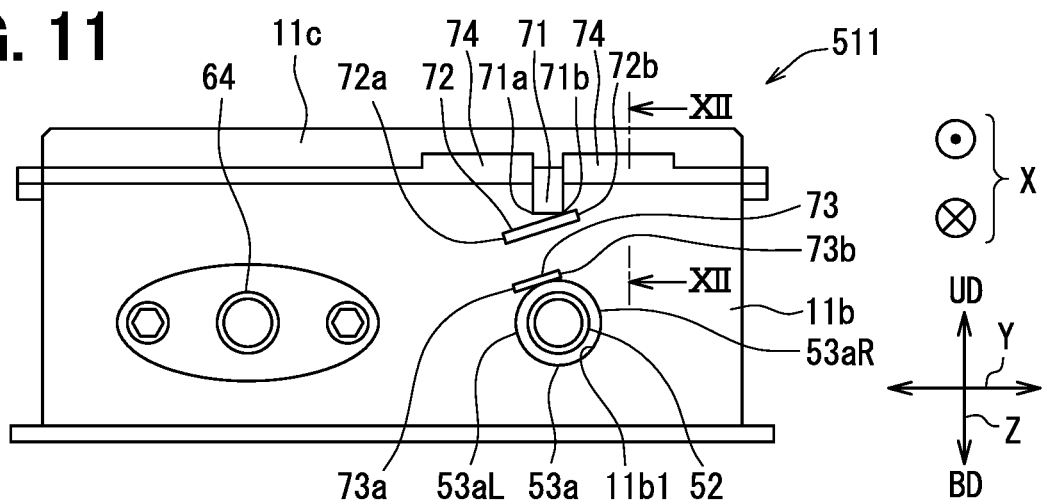
FIG. 11 is a front view showing a seal portion, a water guide portion, and shielding ribs of a sixth embodiment.
Figure 12:
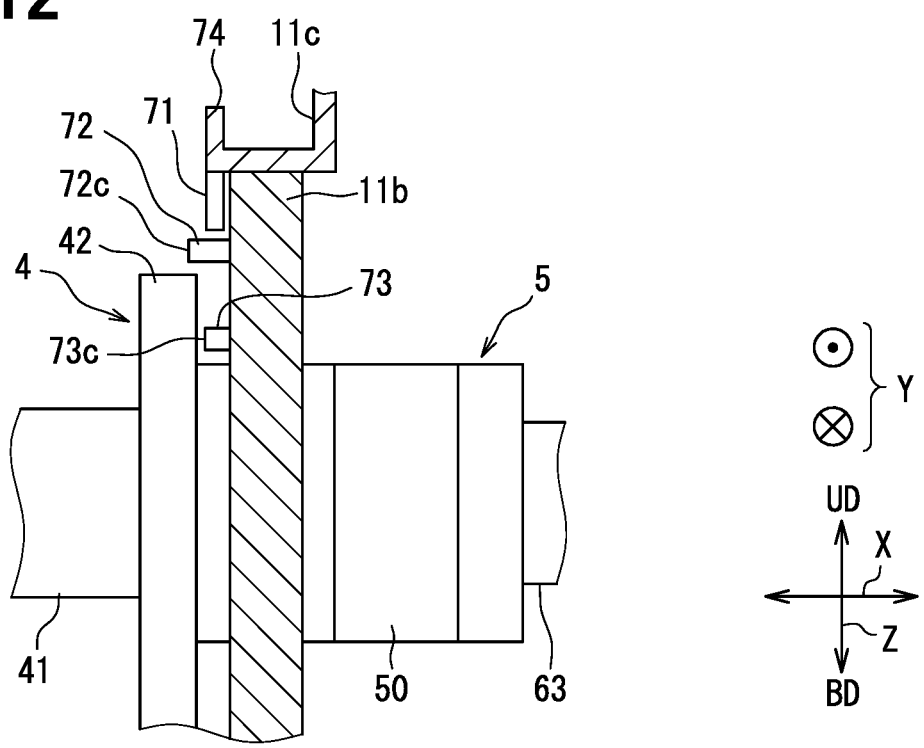
FIG. 12 is a partial cross-sectional view taken along a line XII-XII in FIG. 11.

As shown in FIG. 11 and FIG. 12, the case 511 includes water barrier portion 74 which works as a levee for guiding water to the water guide portion 71. If the cover member 11c get wet with water or the like, the water barrier portion 74 controls a water flow. The water barrier portion 74 is provided in a predetermined range on the outer peripheral edge of the cover member 11c. The water barrier portion 74 is a wall portion extending upward from the outer peripheral edge of the cover member 11c. The water barrier portions 74 are provided on both horizontal sides of the water guide portion 71.

If the cover member 11c gets wet with water or the like, water or the like flows down to the outer peripheral edge side of the cover member 11c. Water or the like that has flowed down to both sides of the water guide portion 71 of the outer peripheral edge is blocked by the water barrier portions 74. The water barrier portions 74 guides water to both side ends of the water barrier portions 74. Both side ends of the water barrier portions 74 are located on outer sides further than both side ends of the seal member 53a in the horizontal direction. In other words, both side ends of the water barrier portions 74 are located on outer sides further than both side ends of the insertion hole in the horizontal direction. Only a small amount of water may be guided to a slit between the water barrier portions 74. At a portion of the outer peripheral edge away from the water guide portion 71, water or the like falls from both side ends of the water barrier portions 74, therefore water or the like does not easily reach the insertion hole of the case 511. Water or the like impeded by the water barrier portions 74 only flows down along the surface of the water guide portion 71 from the slit of the water barrier portions 74. Water flowing along the surface of the water guide portion 71 takes path described in the above embodiment and is drained below the power control device. According to the sixth embodiment, the drainage path from the water guide portion 71 to the shielding rib can be facilitated, which contributes to reducing the water exposure of the seal member 53a.

Seventh Embodiment

A power control apparatus 1 according to a seventh embodiment is described with reference to FIG. 11. The power control apparatus of the seventh embodiment is different from the above-described embodiments only in an installation posture of the power control apparatus. Configurations, actions, and effects not particularly described in the seventh embodiment are similar to those of the above-described embodiments, and differences from the above-described embodiments will be described below.

Figure 13:
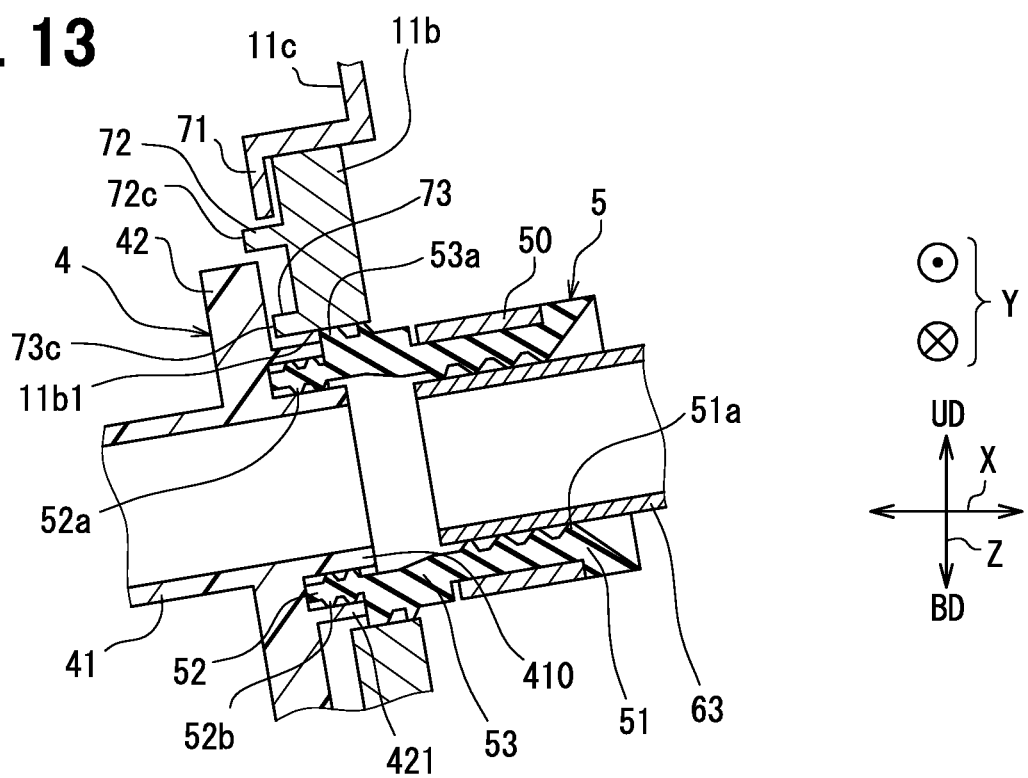
FIG. 13 is a front view showing a seal portion, a water guide portion, and shielding ribs of a seventh embodiment.

As shown in FIG. 13, the case 11 of the seventh embodiment is located in a posture inclined with respect to the vertical direction so that the distal end portion of the shielding rib is located lower than a proximal end thereof. The power control apparatus is installed in a vehicle or the like in such a tilted posture. Such an inclination of the case 11 may be, e.g., 20 degrees or less, 15 degrees or less, more preferably 10 degrees or less with respect to the vertical direction along the direction of gravity. According to this configuration, water or the like that has flowed down the surface of the water guide portion 71 can easily flow toward the distal end portion on the upper surface of the shielding rib, and water or the like can be dropped from a position away from the seal member 53a. Therefore, since water or the like does not enter the inner peripheral surface 11b1 of the insertion hole provided in the case 11, it is possible to reduce a water exposure of the seal member 53a.

Other Embodiments

The disclosure of this specification is not limited to the illustrated embodiment. The disclosure encompasses the illustrated embodiments and variations based on the embodiments by those skilled in the art. For example, the disclosure is not limited to the combinations of components and elements shown in the embodiments, and various modifications and implementations can be performed. The disclosure may be implemented in various combinations. The disclosure may have additional portions that may be added to the embodiments. The disclosure includes the embodiments from which the parts and the components are omitted. The disclosure encompasses the replacement or combination of components, elements between one embodiment and another. The disclosed technical scope is not limited to the description of the embodiments. It should be understood that some disclosed technical ranges are indicated by description of claims, and includes every modification within the equivalent meaning and the scope of description of claims.

A power control apparatus capable of achieving the object disclosed in the specification may be configured to include either a converter device or an inverter device.

A power control apparatus capable of achieving the object disclosed in the specification may be configured without the capacitor 23 for noise reduction and the smoothing capacitor 3.

A power control apparatus capable of achieving the object disclosed in the specification may be configured without the booster circuit 210 as a power control circuit.

The cooler 6 included in the power control apparatus disclosed in the specification may be configured to cool the semiconductor module 2 on only one side. The cooler 6 may be configured not only in contact with the semiconductor module 2 but also to be thermally coupled with the semiconductor module 2 via another member.

The case included in the power control apparatus disclosed in the specification may be made of, for example, a resin material, and may not be made of a metal material. If the case is not made of metal, the case preferably has a shield layer made of a metal which has a function as a magnetic shield.

What is claimed is:

1. A power control apparatus, comprising:
   a power control circuit configured to perform power conversion and supply an electric current to a load;
   a cooler which has a cooling passage and performs absorbing heat generated by the power control circuit while a cooling fluid flows through the cooling passage;
   a case which accommodates the power control circuit and the cooler;
   a seal member which seals a gap between a pipe forming a passage communicating with an interior of the cooler and the case through which the pipe is inserted;
   a water guide portion forming a wall extending downward from a cover member located at an upper portion of the case; and
   a visor-like shielding rib disposed to protrude with respect to the case and to cover a lower side of the water guide portion, wherein
   the shielding rib include a portion located above the seal member to overlap the seal member with respect to a vertical direction, and wherein
   the shielding rib has an inclined portion in which a one-side portion in a horizontal direction is located lower than the other-side portion.

2. The power control apparatus according to claim 1, wherein
   the one-side portion of the shielding rib is located on one side further than a one-side of the seal member in the horizontal direction.

3. The power control apparatus according to claim 1, wherein
   the shielding rib has a length that covers an entire body of the seal member in the horizontal direction.

4. The power control apparatus according to claim 1, wherein
   the shielding rib includes a first shielding rib located directly below the water guide portion and a second shielding rib located directly below the first shielding rib;
   each of the first shielding rib and the second shielding rib has an inclined portion in which a one-side portion in the horizontal direction is located lower than the other-side portion.

5. The power control apparatus according to claim 4, wherein
   at least one of the first shielding rib and the second shielding rib has a one-side portion in the horizontal direction which is located on a one side further than a one-end portion of the seal member in the horizontal direction.

6. The power control apparatus according to claim 4, wherein
   a length in the horizontal direction of the first shielding rib and the second shielding rib is enough to cover an entirety in the horizontal direction of the seal member with respect to a vertical view of the first shielding rib and the second shielding rib from above.

7. The power control apparatus according to claim 1, wherein
   the case is installed in a posture inclined with respect to the vertical direction so that a distal end of the shielding rib is located lower than a proximal end thereof.

* * * * *